Dec. 18, 1962 A. LUNGO 3,069,626

REFLEX AMPLIFIER CIRCUIT WITH VOLUME CONTROL MEANS

Filed June 24, 1957 3 Sheets-Sheet 1

INVENTOR.
ANTONIO LUNGO
BY Francis D. Marsella
ATTORNEY

Dec. 18, 1962 A. LUNGO 3,069,626

REFLEX AMPLIFIER CIRCUIT WITH VOLUME CONTROL MEANS

Filed June 24, 1957 3 Sheets-Sheet 2

*INVENTOR.*

ANTONIO LUNGO

BY Francis L. [signature]

ATTORNEY

REFLEX AMPLIFIER CIRCUIT WITH VOLUME CONTROL MEANS

Filed June 24, 1957 3 Sheets-Sheet 3

INVENTOR.
ANTONIO LUNGO
BY Francis L. Masselle
ATTORNEY

United States Patent Office 3,069,626
Patented Dec. 18, 1962

3,069,626

REFLEX AMPLIFIER CIRCUIT WITH VOLUME CONTROL MEANS

Antonio Lungo, Cleveland, Ohio, assignor to Clevite Corporation, Cleveland, Ohio, a corporation of Ohio Filed June 24, 1957, Ser. No. 667,349
17 Claims. (Cl. 325—486)

This invention relates to signal translating circuits, and particularly to reflex circuits for amplifying signals in both the audio and high frequency range.

Reflex amplifier circuits have been known in the art for decades; however, due to certain problems which heretofore have defied solution, such circuits have been of theoretical or academic interest only. Insofar as is known no practical commercial reflex circuit has been produced and, as a matter of fact, may textbooks on circuitry fail event to mention reflex circuits.

In a reflex circuit, a composite signal having at least two components of different frequency ranges is passed through one stage, detected, and the detected signal returned or fed back from the output to the input of the stage. Thus the stage translates two signals simultaneously: the original input signal and the reflexed input.

One of the problems of reflex circuits is the inherent tendency of the stage to overload. In addition, such circuits are susceptible to distortion and inherent difficulties in volume control and maintaining separation of the original and reflexed signals.

In addition to overcoming problems particularly connected with reflex circuits, the present invention contemplates improvements in means for neutralizing amplifiers and for increasing the efficiency of detector circuits.

It is, therefore, a general object of the present invention to provide novel and improved signal translating circuits.

More specifically, it is an object to provide a multi-stage I.F.-A.F. reflex amplifier with improved neutralization and an improved diode detector.

Another object is the provision of a high-gain, neutralized, high frequency amplifier.

Still another object is the provision of a novel and improved volume control for reflex circuits.

A further object is the provision of a transistorized I.F.-A.F. reflex amplifier circuit which is simple, compact and characterized by reduced number of components as compared to comparable prior art circuits.

A still further object is the provision of a multi-stage amplifier having two useful pass bands and in which the signals in both pass bands appear across the same terminals as they are fed from one stage to another.

These and other objects of the invention and the manner of their accomplishment will be apparent to those skilled in the art from the following description and subjoined claims taken in conjunction with the annexed drawings in which, FIGURE 1 is a block diagram of a multi-stage amplifier in accordance with the present invention;

Figure 1:
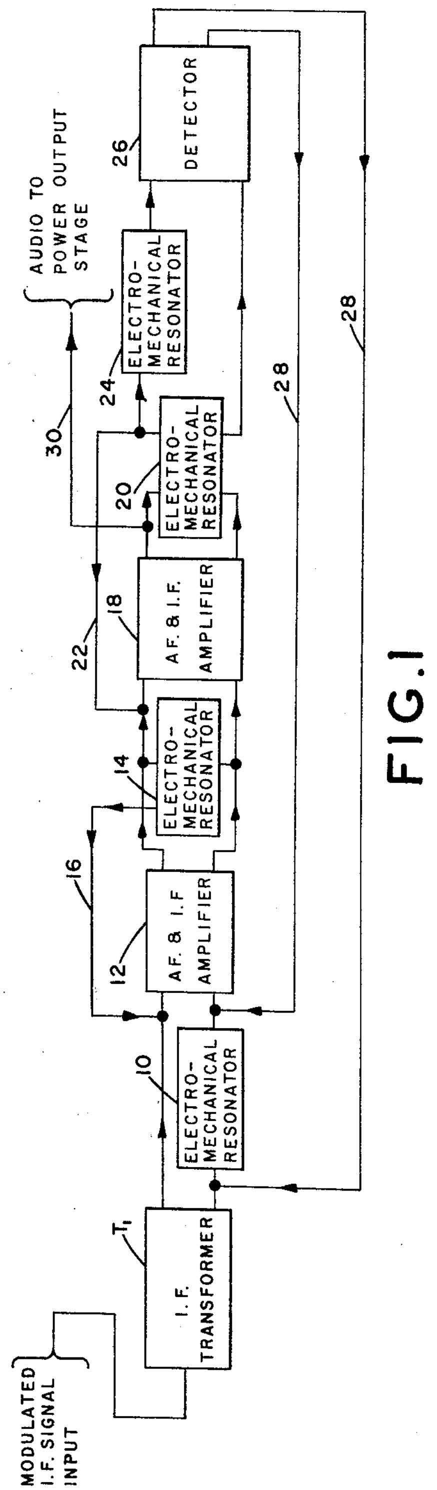

Signal translating circuits according to the present invention comprise an amplifier stage having an input and an output, means for applying to the input of the stage a signal comprising two distinct frequency bands, and resonator means in the input of said stage offering high impedance to one frequency band of said signal and low impedence to the other frequency band. Electromechanical resonator means are provided in the output of the amplifier stage for generating a neutralizing signal continuously in phase opposition to the upper frequency band signal at said stage and means are provided for feeding the neutralizing signal back to the input of the stage. A current divider means is coupled between the amplifier stage and the next succeeding stage for controlling the gain of signals passing to said succeeding stage. A detector separates the frequency bands and signals of the lower frequency band are returned to the input of the amplifier stage. A power output network also is provided together with means for blocking signals of the lower frequency band from the detector and feeding them to the power output network.

Referring now to the drawings and first, particularly, to FIGURE 1, the invention is illustrated in its broader aspects by means of a block diagram, the various components of which will be described in detail hereinafter where necessary to an understanding of the invention.

The block diagram in FIGURE 1 shows the invention as applied to an I.F.-A.F. amplifier although it will be appreciated that the novel concepts disclosed herein, or some of them, may be applied to other circuits and frequency ranges. As shown by the block diagram a signal, in this case an intermediate frequency (e.g. 455 kc.) signal modulated by an audio frequency signal, passes from an I.F. transformer $T_1$ to an electromechanical resonator 10. Resonator 10, hereinafter more fully described, preferably is a piezoelectric resonator having a fundamental resonant frequency coinciding with the intermediate frequency (455 kc. in this exemplary case) and, therefore, presenting a very low impedance to the input signal. Consequently, the signal passes substantially undiminished to the input side of a first amplifier 12. The output signal from amplifier 12 is applied to a second electromechanical resonator 14 which, in a manner hereinafter described, generates a neutralizing signal which, in the region of operation, is continuously in phase opposition to the output from amplifier 12. The neutralizing signal is fed back, as indicated by line 16, to the input side of amplifier 12. The output from amplifier 12 also is fed to a second amplifier stage 18, and an electromechanical resonator 20 in series. Transducer 20, like transducer 14, generates a neutralizing signal which is fed back to the input of amplifier 18, as indicated by line 22. The output of transducer 20 also is fed to an electromechanical resonator 24 which, like transducer 10, preferably is a piezoelectric resonator which is resonant at a frequency substantially coinciding with that of the I.F. signal. Therefore, resonator 24 has a very low impedance to and passes the modulated I.F. signal to a detector 26.

The A.F. signal from detector 26 is reflexed, as indicated by lines 28, to the input of first amplifier 12 where it is applied across resonator 10. The A.F. signal passes through the various stages and is amplified in generally the same manner as the modulated I.F. signal up to the point where it leaves amplifier 18. Here, the A.F. is blocked by the high impedance of transducer 20 to frequencies other than its anti-resonant frequency. Consequently, the A.F. signal takes a low impedance path, designated by line 30, to a power output or signal utilization stage (not shown).

Figure 2:
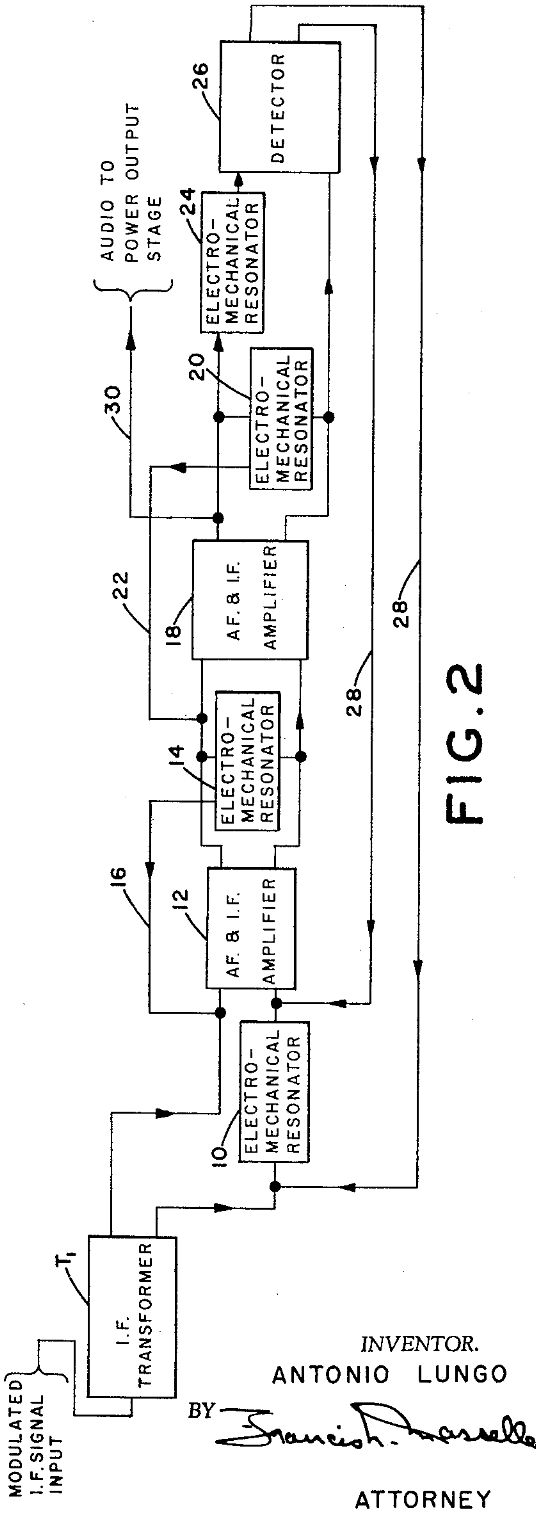
FIGURE 2 is a block diagram of a modified form of the amplifier shown in FIGURE 1.

A block diagram of a modified form of the FIGURE 1 circuit is shown in FIGURE 2, wherein the various components are the same as in FIGURE 1 and are correspondingly numbered. The difference in the circuits consists in this: in the FIGURE 1 circuit, resonator 20 is in series with the second amplifier stage 18, whereas in FIGURE 2, resonator 20 is shunted across the second amplifier in the same manner as resonator 14 is shunted across the first amplifier.

Figure 3:
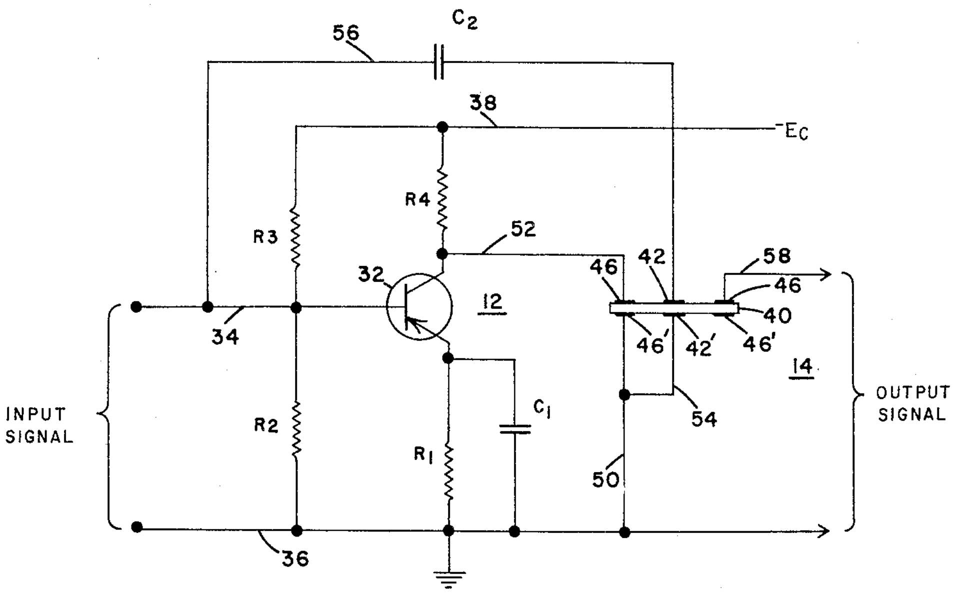
FIGURE 3 is a schematic circuit diagram of one amplifier stage neutralized in accordance with the present invention.

One important feature of the present invention resides in the stabilization of high frequency amplifiers such as are designated 12 and 18 in FIGURES 1 and 2. A simplified schematic circuit diagram of one amplifier stage according to the present invention is shown in FIGURE 3. The amplifier comprises a PNP transistor triode 32 but it will be understood that any current or voltage amplifying device, e.g., a vacuum tube or other types of transistors may be used.

Transistor 32 comprises the usual electrodes—emitter, collector and base—represented in the drawings by conventional symbols. In the circuit, transistor 32 is connected in a common emitter configuration, which, in itself, is well known in the art. Thus, a conductor 34, connected directly to the base of the transistor, and a second conductor, 36, connected to the emitter through a bias resistor $R_1$, form the input circuit of the transistor. A capacitor $C_1$ by-passes resistor $R_1$. The incoming signal appears across a resistor $R_2$ connected between conductors 34 and 36. The transistor base is connected through resistor $R_3$ to a source of negative potential $-E_c$ by conductor 38. An impedance, represented by resistor $R_4$ is connected between the collector and conductor 38; in the absence of a succeeding stage or other load, $R_4$ acts as the load impedance.

As thus far described, the amplifier stage is generally conventional. In accordance with the present invention an electromechanical resonator 14 is provided for supplying a signal to compensate for and neutralize the characteristic interelectrode capacitance of transistor 32, thus stabilizing the stage against oscillation.

Figure 4:
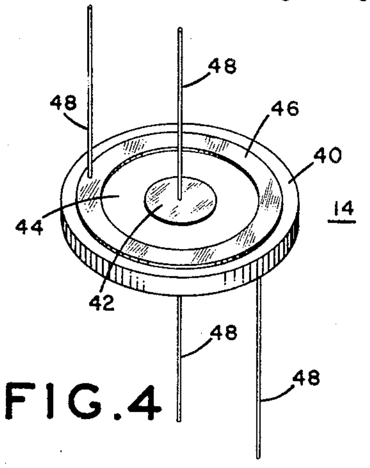
FIGURE 4 is a perspective elevational view of a preferred form of electromechanical transducer utilized in circuits according to the present invention.

In its preferred form, resonator 14 is a piezoelectric resonator consisting of a thin disk 40 of ferro-electric ceramic material, as best shown in FIGURE 4, poled in its thickness direction. Examples of the materials contemplated for the construction of disk 40 are barium titanate and lead zirconate titanate and modifications thereof. Transducers of these materials are described in detail, respectively, in U.S. Patent No. 2,486,560 to Gray and U.S. Patent No. 2,708,244 to B. Jaffe. Additional examples of suitable materials are described in U.S. Letters Patent No. 2,906,710 issued on application Serial No. 527,720, filed August 11, 1955, and U.S. Letters Patent No. 2,911,370 issued on a continuation of abandoned applications Serial Nos. 550,868 and 550,869, filed December 5, 1955, all of which applications are assigned to the same assignee as the present invention.

It is well known in the art that these materials, hereinafter referred to as piezoelectric ceramics, may be polarized by the application of an electrostatic field and retain a high degree of polarization after the field is removed. Thus polarized, the ceramics exhibit an electromechanical response similar to the well-known piezoelectric phenomena exhibited by many crystalline substances such as quartz, Rochelle salt and ammonium dihydrogen phosphate.

For an understanding of the present invention, it is only necessary to appreciate that disk 40, axially poled, will respond to A.-C. signals applied to its faces, by radial mode vibrations. The disk can be proportioned for resonant vibration, fundamental or overtime, at a desired frequency. For the purposes of the present invention, disk 40 is proportioned to have a first overtone anti-resonance in the radial mode at a frequency which substantially coincides with that of the applied signal. In the circuits being described by way of example, this is the intermediate frequency 455 kc. and the disk would have a diameter of roughly 0.5 inch; the exact dimension would depend on the particular ceramic material used.

A complete description of piezoelectric resonators such as transducer 14 is contained in U.S. Letters Patent No. 2,969,512 issued on a continuation of abandoned application for Serial No. 610,103, filed September 17, 1956, and assigned to the same assignee as the present invention. As explained therein, the stress distribution curve representing mechanical stresses in a disk vibrating in the radial mode at its first overtone, reaches a maximum point at the center, falls as the point of reference moves radially outward, passes through zero at about 40% of the radius from the center, reverses sign (direction) and reaches a maximum of the opposite sign at about 60% of the radius, and returns to zero once again at the circumferential edge. Inasmuch as the sign of the electrical charge generated by the disk vibration follows the sign of the mechanical stress, a disk can be provided with two electrode pairs, the charges on which are 180° out of phase. Such a disk is illustrated in FIGURE 4, greatly exaggerated in size for the sake of clarity. Thus disk 40 has on one face, uppermost in FIGURE 4, a center electrode 42 which covers a preselected area. Center electrode 42 is surrounded by an unelectroded annular region 44 and then by a concentric annular electrode 46. The electrodes 42 and 46 on the upper face are opposed by corresponding individual electrodes 42′ and 46′, respectively (not visible in FIGURE 4), on the lower face. In some cases, a single electrode can be used on one face of the disk covering substantially its entire area. A suitable lead wire 48 is provided for each of the electrodes.

It will be understood that the areas of the electrodes may be selected to obtain the desired capacitance between electrode pairs, taking into account the thickness of the disk and the dielectric constant of the ceramic. The electrodes are positioned with regard to the stress distribution across the disk so that the charge appearing at the ring electrodes is in phase opposition to that of the center electrodes.

It is pointed out that other suitable resonators may be used, for example, those of the type shown in U.S. Letters Patent No. 2,877,432 issued on application Serial No. 633,052, filed January 8, 1957, and assigned to the same assignee as the present invention.

Referring once again to FIGURE 3, ring electrode 46′ of resonator 14 is connected by a conductor 50 directly to conductor 36 and the other ring electrode 46 is connected directly to the collector of transistor 32 by a conductor 52. Thus the resonator is shunted across the output of the amplifier so that the output signal drives the disk 40 which, because of its design as explained above, vibrates in the radial mode.

The electrodes 42′ and 46′ on the lower face of disk 40 are maintained at equipotential. This is accomplished in the FIGURE 3 schematic by a conductor 54 which connects the center electrode to conductor 50. Obviously, this can be accomplished in several other ways, the simplest and preferred manner being to have only a single electrode covering substantially the entire bottom face of the disk. A conductor 56 connects the center electrode 42 on the upper face of disk 40 through a coupling capacitor $C_2$ and conductor 34 to the base of transistor 32.

An additional lead 58 on the upper ring electrode is provided for coupling the output signal to the succeeding stage or utilization circuits.

With disk 40 driven by the signal applied across ring electrodes 46, 46' another signal, identical but in phase opposition to the applied I.F. signal, is generated by the disk vibrations and appears across center electrodes 42, 42'. This generated signal is fed back through conductor 56 and capacitor $C_2$ to the input circuit of transistor 32 where it acts to neutralize the effect of the interelectrode capacitance of the transistor. It should be noted that the feedback signal is supplied only for I.F. signals.

It will be understood that proper amplitude of the feedback signal can be obtained by appropriate selection of the area of the electrodes and the capacity of $C_2$. It will also be understood that the connections and, therefore, the functions of the center electrodes 42, 42' and ring electrodes 46, 46' may be interchanged, i.e., the output from transistor 32 may be applied to the center electrodes and the neutralizing feedback signal derived from the ring electrodes.

In addition to providing a neutralizing signal, resonator 14 performs a filtering function, the importance of which will be apparent as this description proceeds. Additional information as to the use and characteristics of resonators such as 14 may be had by reference to the aforementioned U.S. Letters Patent No. 2,969,512 and to application Serial No. 643,130, filed February 28, 1957, and assigned to the same assignee as the present invention. Briefly, however, it may be pointed out that the impedance of disk 40 approaches infinity as the signal frequency approaches zero. The impedance drops rapidly with increasing frequency and reaches a minimum at the resonant frequency of the disk and thereafter peaks to a maximum at the anti-resonant frequency. The impedance in the A.F. range is high, being of the same order as the impedance at anti-resonance. Therefore, resonator 14 presents high impedance to signals of its anti-resonant frequency (e.g., 455 kc.) and to A.F. signals and low impedances to other frequencies. In other words, there is high signal output at the I.F. and audio frequencies while other frequencies are severely attenuated or blocked entirely. Thus, resonator 14 gives the amplifier two useful pass bands the importance of which will be seen as this description proceeds.

While the filtering function of, and the two pass bands provided by, resonator 14 are essential in reflex circuits according to this invention, the neutralizing signal alone can be obtained by using a transducer in which the disk 40 is proportioned to operate at resonance, i.e., having its first or higher overtone resonance at or near the I.F.

Figure 5:
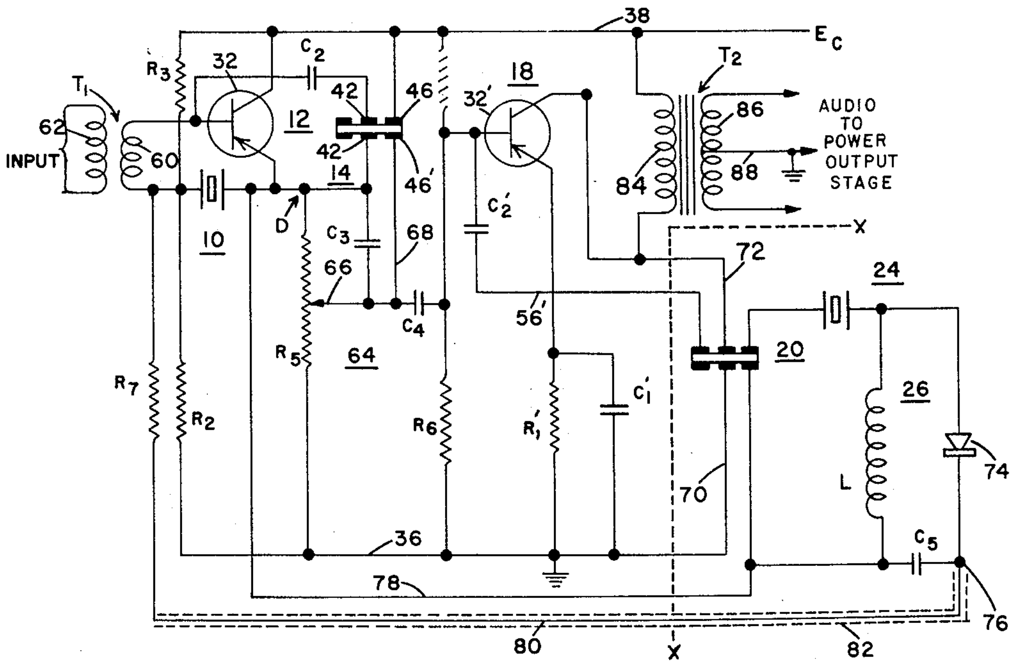
FIGURE 5 is a complete circuit diagram of a multi-stage A.F.-I.F. reflex amplifier embodying the present invention.

Referring now to FIGURE 5, there is illustrated a circuit diagram of a complete A.F.-I.F. reflex amplifier according to the present invention incorporating amplifier stages of the type illustrated in FIGURE 3.

The circuit illustrated in FIGURE 5 corresponds to the block diagram of FIGURE 1; therefore, the major sections of the circuit diagram are assigned underscored reference numbers corresponding to the block diagram. These major sections are electromechanical resonators 10, 14, 20 and 24; amplifiers 12 and 18; and diode detector 26.

Amplifier 12 and resonator 14 are substantially as shown in and already described in conjunction with FIGURES 3 and 4, the same reference numerals being used in these sections; amplifier 18 and transducer 20, generally speaking, are duplications of their counterparts 12 and 14 in the preceding stages of the circuits and corresponding primed reference numerals are assigned. Therefore, it will not be necessary to describe these sections in detail.

The input (i.e., emitter-base) circuit of amplifier 12 contains the secondary winding 60 of I.F. transformer $T_1$. Winding 60 is inductively coupled to the primary winding 62 of transformer $T_1$. To the primary winding 62 is applied a modulated I.F. signal which, in a superheterodyne radio receiver for example, would be the output of the mixer stage.

In series with the secondary winding 60 in the input circuit of amplifier 12 is electromechanical resonator 10. Preferably, transducer 10 is a thin disk of piezoelectric ceramic, as hereinbefore defined, poled in the thickness dimension and having a single electrode on each face. The disk is dimensioned to have a resonant frequency (preferably the fundamental) in the radial mode which coincides with the applied I.F. (e.g., 455 kc.). Insofar as the materials and other considerations affecting resonator 10 are concerned, all that has been explained previously in connection with transducer 14 is applicable. The primary distinctions are that, in the circuit being described, resonator 10 is resonant at the I.F. and resonator 14 is anti-resonant at the I.F.; in addition resonator 10 has only 1 pair of electrodes (2 terminals) and would most likely be designed for fundamental vibration whereas resonator 14 has at least 3 electrodes (3 terminals) and is proportioned for operation at its first or a higher overtone. Reference may be had to the aforementioned copending application Serial No. 643,130 for additional information on the construction and use of piezoelectric transducers such as resonator 10.

One important feature of the reflex circuit shown in FIGURE 5 is the provision of a volume control, between amplifier stages, permitting the individual control of I.F. and A.F. gain. The volume control section is designated generally by reference numeral 64 and comprises a potentiometer having the "bottom" end of its resistor $R_5$ connected to ground potential (conductor 36) and its "top" end to the emitter of transistor 32 and to the bottom center electrode 42' of resonator 14. A shunt capacitor $C_3$ is connected between the top end of resistor $R_5$ and the adjustable tap 66 of the potentiometer. Tap 66 is also connected directly to the lower ring electrode 46' of resonator 14 by conductor 68. The output from amplifier 12 appears across the ring electrodes of resonator 14, drives the resonator and is coupled to the input circuit of amplifier 18 by a capacitor $C_4$.

Amplifier 18 is substantially a repetition of amplifier 14 without the volume control section 64. The output of amplifier 18 is applied to the center electrodes of resonator 20, which may be in all respects identical to resonator 14 already described in detail. Accordingly, the bottom center electrode of resonator 20 is connected directly to ground potential (conductor 36) by conductor 70 and the upper center electrode is connected directly to the collector of transistor 32' by a conductor 72.

The output from resonator 20 appears across the ring electrodes. The upper ring electrode is coupled to the input circuit of transistor 32' by a conductor 56' and capacitor $C_2'$, thus feeding back a neutralizing signal in the manner already described. The output appearing across the ring electrodes of resonator 20 also is fed through resonator 24 to a diode detector 26. Transducer 24 may be in all respects identical to resonator 10, i.e., a thin disk of piezoelectric ceramic dimensioned to have its fundamental resonance of radial mode vibration at a frequency coinciding with the I.F. (e.g., 455 kc.).

Detector 26 comprises a diode 74, and capacitor $C_5$ connected in series across an inductance L. The detector 26 and resonator 24 are connected in series across the ring electrodes of resonator 20. One side of the output of detector 26 is connected by means of conductor 78 to the emitter of transistor 32 while the other side is connected through conductor 80, a resistor $R_7$, and secondary winding 60 of transformer $T_1$ to the base of transistor 32. Thus, the output from detector 26 is fed back to the input of amplifier 12 across transducer 10 and the internal resistance of the transistor together with $R_7$ provide the load impedance for detector 26. Preferably, conductor 80 is suitably shielded as indicated by broken lines 82, the shielding being connected to conductor 78.

An A.F. output transformer $T_2$ is provided for coupling audio signals from amplifier 18 to a power output stage, for example, a Class B push-pull power amplifier (not shown). Transformer $T_2$ has one end of its primary winding 84 connected by conductor 72 directly to both the collector of transistor 32′ and the upper center electrode of resonator 20. The other end of winding 84 is connected to conductor 38 which is substantially at A.C. ground potential. The secondary winding 86 of transformer $T_2$ has a center tap 88 connected to ground potential.

The functioning of the circuit shown in FIGURE 5 is substantially as follows: a modulated I.F. signal applied to the primary winding 62 of I.F. transformer $T_1$ appears across secondary winding 60 in the emitter-base (input) circuit of transistor 32. Resonator 10, resonant at the intermediate frequency, presents a minimum impedance to the applied signal which is amplified by transistor 32 in a manner well known in the art and appears in the emitter-collector (output) circuit of the transistor.

With the center tap 66 of volume control 64 at the top of $R_5$, the etire output of stage 12 is applied to ring electrodes 46, 46′ of resonator 14 and to the input of stage 18. This provides for maximum overall gain and, because the feedback from resonator 14 is also a maximum, provides maximum gain in stage 12.

As previously mentioned, the single volume control 64 controls both I.F. and A.F. gain simultaneously while providing different functional relationships for gain of each frequency. The control initially increases I.F. gain at a higher rate and then increases the A.F. gain. This allows linear detection of the I.F., thus minimizing distortion.

The volume control accomplishes this effect in the following manner: with tap 66 at the top of $R_5$, the effective load into which stage 12 works is the input resistance of the succeeding stage, viz, 18. When operating on the I.F., as tap 66 is moved downwardly, resistive impedance, which we may call $Z_R$, is introduced and the current divides at point D between the resistive impedance branch and the capacitive impedance ($Z_C$) offered by $C_3$. Capacitor $C_3$ is selected to offer blocking impedance to A.F. so that $C_3$ appears as an open circuit to A.F. signals. Consequently, the A.F. current divides, not at point D but divides at the point of tap 66 between $R_5$ and the input resistance of stage 18.

In practice, the relationship between I.F. and A.F. gain can be controlled, within limits, by proper selection of $R_5$ and $C_3$.

It is also to be noted that, as tap 66 is moved downwardly to increase $Z_R$, the resistance is introduced in the circuit to ring electrodes 46, 46′ of resonator 14, thus decreasing the signal applied to drive the resonator 14 and, therefore, the amplitude of the feedback signal. Thus, not only does volume control 64 control the interstage gain but it controls the gain of the preceding stage 12.

Continuing with the description of function, the modulated I.F. signal amplified by stage 12 is passed to and further amplified by stage 18 in conventional manner.

The output of stage 18 is applied across the center electrodes of resonator 20 and a neutralizing signal is fed back from the ring electrodes to the input of stage 18. It will be noted that this arrangement is the reverse of the situation in stage 12 where the resonator is driven by the ring electrodes and the feedback signal derived from the center electrodes.

Connecting resonator 20 in the manner shown has an advantage: the resonator is employed as a passive filter and a favorable impedance transformation can be obtained by selection of the relative areas of the ring and center electrodes.

The signal fed from resonator 20 to detector 26 must pass through resonator 24 which is resonant at 455 kc. Consequently, the modulated I.F. signal is passed by resonator 24 to the detector but signals of other frequencies, including A.F., are blocked.

Detector 26 demodulates the I.F. signal in the conventional manner of a diode detector, capacitor $C_5$ serving to filter out the major portion of the I.F. carrier. Resonator 10 constitutes the second shunt leg of a $\pi$ filter in the detector circuit and provides additional filtering of the I.F. without causing loss of the higher audio frequencies. Ordinarily a capacitor used in place of resonator 10, in order to be effective at I.F. frequencies, would attenuate high audio frequencies. Furthermore, because the internal resistance of transistor 32 is utilized as part of the load impedance for the detector, the efficiency of the detector is increased.

The A.F. signal from detector 26 is reflexed by conductors 78 and 80 to the input circuit of transistor 32 where it is applied across resonator 10. Inasmuch as resonator 10 is resonant at about 455 kc., it presents a high impedance to the A.F. signal whereas secondary winding 60 of transformer $T_1$ presents a low impedance. At this juncture it is pointed out that resonator 10 performs three distinct and important functions:

(1) A series bypass or feedthrough filter for I.F. signal;

(2) A blocking impedance for A.F. to prevent A.F. from bypassing stage 12; and (3) The second shunt leg of the $\pi$ filter in the detector circuit 26.

The reflexed A.F. signal is amplified in stage 12. The resonator 14 has no effect as far as A.F. is concerned and consequently may be considered as being removed leaving an open circuit between its electrode connections.

The A.F. passes from stage 12 to 18 and there is further amplified and appears across primary winding 84 of A.F. transformer $T_2$. Because resonator 20 does not respond to A.F., audio signals are not passed to the detector. Resonator 24 also blocks A.F. signals.

Transformer $T_2$ performs three functions: (1) conventionally, it transmits the A.F. signal to the power output stage; (2) uniquely, it serves as an I.F. choke, blocking most of the I.F. from the audio power stage: (3) it transmits a small amount of I.F., by means of interwinding capacitance, which is utilized to bias the tubes or transistors in the push-pull class B audio power amplifier. This last function will now be explained in greater detail.

It is well known that class B push-pull audio power amplifiers are characterized by cross-over distortion at low signal levels if operated at zero bias. This entire problem is discussed in RCA Laboratories Report LB-1072 entitled "Circuit Considerations for Audio-Output Stages Using Power Transistors." It is a conventional solution to the problem to provide a small D.-C. bias.

According to the present invention, the I.F. signal is used to provide bias for the power amplifier. This is accomplished in the following manner. Owing to the circuit arrangement shown in FIGURE 5, both I.F. and A.F. signals appear across the primary winding 84 of audio output transformer $T_2$. While the transformer, as such, does not transmit I.F. to the secondary, a small amount of I.F. passes through the transformer due to capacitance between the windings. This I.F. appears at both ends of the secondary 86 in phase because transmitted by capacitor rather than transformer action. This I.F. is sufficient to bias the tubes or transistors of the push-pull audio power amplifier and has the advantage of being present only when I.F. is being received by the circuit.

Figures 6, 7:
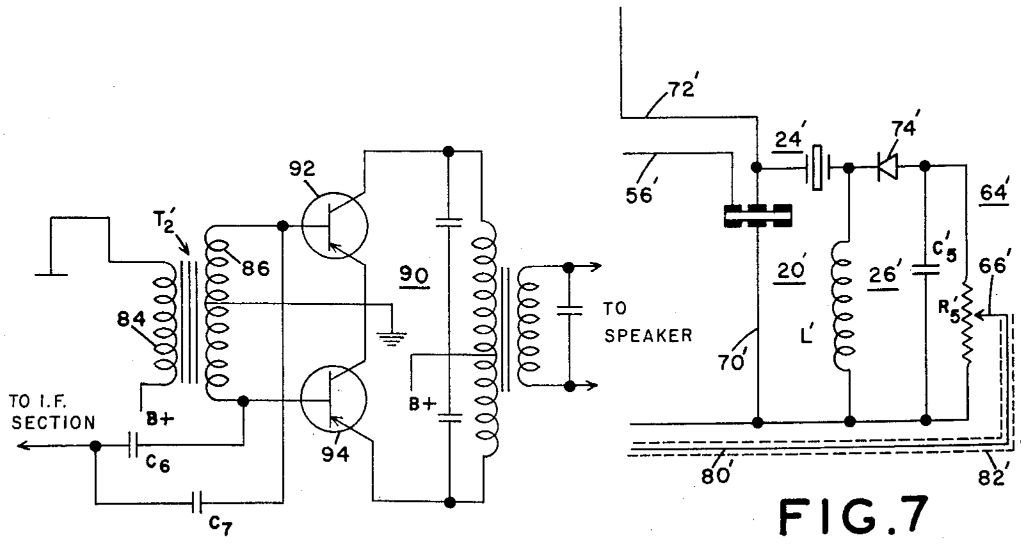
FIGURES 6 and 7 are fragmentary modified forms of the circuit shown in FIGURE 5.

FIGURE 6 illustrates an audio transformer $T_2'$ coupled to a transistor class B push-pull audio power amplifier designated generally by reference numeral 90. This circuit demonstrates an alternative manner of utilizing I.F. to bias a class B amplifier. In this case it is assumed that there is no I.F. reaching the primary winding 85 of transformer $T_2$. To provide the I.F. bias, a pair of small capacitors $C_6$ and $C_7$ are used which couple the I.F. source (e.g., the I.F. section of a radio receiver) to the base of each of a pair of transistors 92 and 94 connected in push-pull in the usual manner.

In the FIGURE 5 circuit, a small capacitor can be used to couple the high side of primary 84 to each end of the secondary 86, to provide bias where the interwinding capacitance of transformer $T_2$ is too low for the purpose.

Referring now to FIGURE 7, there is illustrated a fragment of a modified form of reflex circuit according to the present invention. FIGURE 7 corresponds to that portion of FIGURE 6 to the right of and below broken line X–X. The remainder of the FIGURE 7 circuit is substantially identical to FIGURE 6 except that volume control section 64 is omitted. The primary difference in the FIGURE 7 circuit is that reasonator 20′ is connected in shunt across the output of the amplifier stage 18. In this arrangement resonator 20′ does not prevent A.F. from entering detector 26′; this function is performed entirely by resonator 24′. Another difference is that a conventional volume control placement 64′ is employed. The detected signal is returned to the input of the first amplifier stage 12 where it is capacitor-coupled to the transistor 32.

Figure 8:
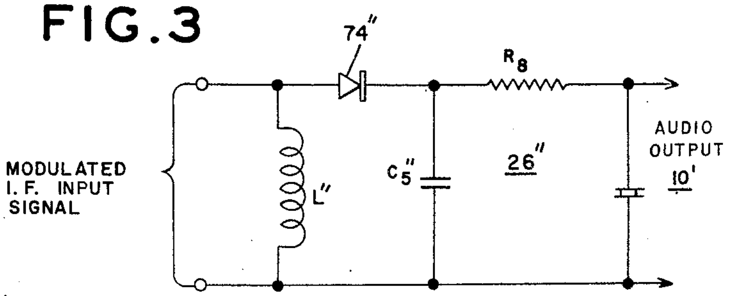
FIGURE 8 is a circuit diagram of a detector, according to the invention, utilized in the circuits represented in FIGURES 1, 2, 5, 6 and 7.

FIGURE 8 illustrates diode detector 26 (FIGURE 5) in a generalizing form, designated generally as 26″ Neglecting the input branch, detector 26″ is a two-mesh network: one mesh comprises an input impedance represented by choke L″, a diode 74″, and a capacitor $C_5''$ which forms the common branch of both meshes. The second mesh comprises, in addition to capacitor $C_5''$, a piezoelectric resonator 10′ and an impedance represented by resistor $R_8$. Resonator 10′ may be in all respects identical to resonator 10 (FIGURE 5). Resistor $R_8$ may be replaced by a choke for maximum detector efficiency.

It will be apparent that the second mesh amounts to a $\pi$ filter with resonator 10′ in the second shunt leg rather than the conventional capacitor. The functioning of the detector is as already described in conjunction with FIGURE 5.

While there have been described what are at present considered to be the preferred embodiments of the invention, it will be obvious to those skilled in the art that various changes and modifications may be made therein without departing from the invention, and it is, therefore, aimed in the appended claims to cover all such changes and modifications as fall within the true spirit and scope of the invention.

I claim:

1. A signal translating circuit comprising an amplifier stage having an input and an output; means for applying to the input of said stage a signal comprising two distinct frequency bands; means in the input of said stage offering low impedance to the upper frequency band of said signal and high impedance to the lower frequency band; electromechanical resonator means in the output of said stage for generating a neutralizing signal continuously in phase opposition to the signals of said upper frequency band in the output of said stage; means for feeding said neutralizing signal back to the input of said stage; current divider means coupled between said stage and the next succeeding stage for controlling the gain of signals passing to said succeeding stage; a detector coupled to the output of said succeeding stage for separating said frequency bands and returning signals of the lower frequency band to the input of said amplifier stage; a power output network; means for blocking signals of said lower frequency band from said detector network and feeding said signals to said power output network; means in said power output network for partially blocking signals of the upper frequency band; and a class B push-pull amplifier coupled to said power output network and biased for linear operation by signals of said upper frequency.

2. A signal translating circuit according to claim 1 wherein said current divider comprises capacitor and an adjustable resistor connected in parallel between the output of said one stage and the input of said succeeding stage.

3. A signal translating circuit comprising an amplifier stage having an input and an output; means for applying to the input of said stage a modulated I.F. signal; first piezoelectric resonator means in the input of said stage offering low impedance to said I.F. signal and high impedance to signals of other frequencies; second piezoelectric resonator means shunt-connected across the output of said stage for generating a neutralizing signal continuously in phase opposition to the I.F. signal output of said stage; means for feeding said neutralizing signal back to the input of said stage; current divider means coupled between said stage and the next succeeding stage for simultaneously controlling the gain of signals passing to said succeeding stage; a diode detector and filter network, coupled to the output of said succeeding stage for demodulating said I.F. signal and returning an A.F. signal to the input of said amplifier stage; a power output network including an A.F. transformer having a primary winding and a secondary winding; a class B push-pull audio power amplifier coupled to the secondary winding of said transformer; third piezoelectric resonator means for blocking A.F. signals from said detector network; and conductor means feeding A.F. and I.F. signals to the primary winding of said transformer.

4. A signal translating circuit according to claim 3 wherein said first piezoelectric resonator means is shunt-connected across the output of said detector.

5. A signal translating circuit according to claim 3 wherein said first and third piezoelectric resonator means each consists of thin piezoelectric disks having a fundamental resonance frequency of radial mode vibration coinciding substantially with the frequency of said I.F. signal, each said disk having an electrode on each face.

6. A signal translating circuit according to claim 3 wherein said second piezoelectric resonator means consists of a thin piezoelectric disk having a first overtone anti-resonance frequency of radial mode vibration coinciding substantially with the frequency of said I.F. signal, said disk having two pairs of opposed electrodes respectively located at regions on said disk where the vibrational stresses therein are of opposite phase.

7. In combination with a band-pass amplifier having two separate and distinct useful pass bands an amplification stage including a transistor having a signal input electrode, a signal output electrode and an electrode common to the signal input and output circuits of said transistor; and a shunt path across said output circuit, connecting between said output and common electrodes, consisting of a piezoelectric ceramic resonator and, exclusive thereof, only non-reactive impedance said resonator having an anti-resonant frequency coinciding with the desired center frequency of the uppermost pass band.

8. A band-pass amplifier according to claim 7, said resonator comprising a thin disk of piezoelectric ceramic polarized in its thickness direction and proportioned so that said anti-resonant frequency is the first overtone of said disk in its radial mode of vibration; two pairs of opposed electrodes respectively located at regions on said disk where the vibrational stresses are of opposite phase; and means for feeding the output from one pair of said electrodes back to said input circuit.

9. In combination with a reflex circuit having at least two amplifier stages, a manual volume control comprising: a resistor connected across the output circuit of the first of said stages; an adjustable tap for said resistor; a capacitor presenting blocking impedance to audio frequencies coupling said tap to the upper end of said resistor; and means coupling the input of the second stage between said tap and said capacitor.

10. An A.F. and I.F. reflex amplifier comprising: a first transistor amplifier stage having an input and an output circuit; a first piezoelectric resonator, resonant at the I.F. frequency, connected in series in said input circuit; a second piezoelectric resonator having a first-overtone anti-resonance at said I.F. frequency, said second resonator having respective drive and output electrodes located at regions where its vibrational stresses are of opposite phase; means coupling the drive electrodes of said resonator in the output circuit of said first amplifier stage; means coupling the output electrodes of said resonator to the input circuit of said first amplifier stage; a second transistor amplifier stage having an input and an output circuit; means coupling the output circuit of said first transistor amplifier stage to the input circuit of said second transistor amplifier stage; a third piezoelectric resonator having a first overtone anti-resonance at said I.F. frequency, said third resonator having respective drive and output electrodes located at regions where its vibrational stresses are of opposite phase; means coupling the output circuit of said second amplifier stage to the drive electrodes of said third resonator and the output electrodes of said third resonator to the input circuit of said second amplifier stage; an audio output transformer having a primary and a secondary winding; means coupling the output circuit of said second amplifier stage to the primary winding of said transformer; a detector network; means coupling the output electrodes of said second resonator to said detector network; and means coupling the output of said detector to the input circuit of said first amplifier stage across said first piezoelectric resonator.

11. A reflex circuit according to claim 10 including a volume control comprising: a resistor having one end connected to the output of the first of said stages; an adjustable tap for said resistor; a capacitor coupling said tap to said one end of said resistors; and means coupling the input of the second stage between said tap and said capacitor.

12. An A.F. and I.F. reflex amplifier comprising: a first transistor amplifier stage having an input and an output circuit; a first piezoelectric resonator, resonant at the I.F. frequency, connected in series in said input circuit; a second piezoelectric resonator having a first-overtone anti-resonance at said I.F. frequency, said second resonator having respective drive and output electrodes located at regions where its vibrational stresses are of opposite phase; means coupling the drive electrodes of said resonator in the output circuit of said first amplifier stage; means coupling the output electrodes of said resonator to the input circuit of said first amplifier stage; a second transistor amplifier stage having an input and an output circuit; means coupling the output circuit of said first transistor amplifier stage to the input circuit of said second transistor amplifier stage; a third piezoelectric resonator having a first overtone anti-resonance at said I.F. frequency, said third resonator having respective drive and output electrodes located at regions where its vibrational stresses are of opposite phase; means coupling the output circuit of said second amplifier stage to the drive electrodes of said third resonator and the output electrodes of said third resonator to the input circuit of said second amplifier stage; an audio output transformer having a primary and a secondary winding; means coupling the output circuit of said second amplifier stage to the primary winding of said transformer; a detector network; means coupling the output circuit of said second amplifier stage to said detector network; and means coupling the output of said detector to the input circuit of said first amplifier stage across said first piezoelectric resonator.

13. An A.F. and I.F. reflex amplifier comprising: a first transistor amplifier stage having an input and an output circuit; a first piezoelectric resonator, resonant at the I.F. frequency, connected in series in said input circuit; a second piezoelectric resonator having a first-overtone anti-resonance at said I.F. frequency, said second resonator having respective drive and output electrodes located at regions where its vibrational stresses are of opposite phase; means coupling the drive electrodes of said resonator in the output circuit of said first amplifier stage; means coupling the output electrodes of said resonator to the input circuit of said first amplifier stage; a second transistor amplifier stage having an input and an output circuit; means coupling the output circuit of said first transistor amplifier stage to the input circuit of said second transistor amplifier stage; a third piezoelectric resonator having a first overtone anti-resonance at said I.F. frequency, said third resonator having respective drive and output electrodes located at regions where its vibrational stresses are of opposite phase; means coupling the output circuit of said second amplifier stage to the drive electrodes of said third resonator and the output electrodes of said third resonator to the input circuit of said second amplifier stage; an audio output transformer having a primary and a secondary winding; means coupling the output circuit of said second amplifier stage to the primary winding of said transformer; a detector network; means coupling the output circuit of said second amplifier stage to said detector; means coupling the output of said detector to the input circuit of said first amplifier stage across said first piezoelectric resonator; a class B push-pull amplifier coupled to the secondary winding of said audio output transformer; and capacitive means for applying an I.F. signal from said amplifier stages to bias said push-pull amplifier.

14. An A.F. and I.F. reflex amplifier according to claim 13 wherein said capacitive means consists of the inter-winding capacitance of said audio output transformer.

15. An A.F. and I.F. reflex amplifier according to claim 13 wherein said capacitive means includes a pair of capacitors each coupling a respective end of said push-pull circuit to a source of I.F. signal potential in said amplifier stages.

16. In combination with an I.F.-A.F. reflex amplifier circuit having an input and an output, a diode detector network coupled to the amplifier output and comprising: two adjacent meshes, the common branch containing a capacitor and, in addition thereto, one of said meshes consisting of an impedance and a diode connected in series and the other consisting of an impedance and a piezoelectric resonator connected in series, said resonator being connected in series with the input of said circuit and having a resonant frequency coinciding with the I.F. of said circuit.

17. A signal translating circuit comprising an amplifier stage having an input and an output; means for applying to the input of said stage a signal comprising two distinct frequency bands; means in the input of said stage offering low impedance to the upper frequency band of said signal and high impedance to the lower frequency band; electromechanical resonator means in the output of said stage for generating a neutralizing signal continuously in phase opposition to the signals of said upper frequency band in the output of said stage; means for feeding said neutralizing signal back to the input of said stage; current divider means coupled between said stage and the next succeeding stage for controlling the gain of signals passing through said succeeding stage; a detector coupled to the output of said succeeding stage for separating said frequency bands and returning signals of the lower frequency bands to the input of said amplifier stage; a power output network; and means for blocking signals of said lower frequency band from said detector network and feeding said signals to said power output network.

References Cited in the file of this patent

UNITED STATES PATENTS

| | | |
|---|---|---|
| 1,732,710 | Batsel | Oct. 22, 1929 |
| 1,741,363 | Green | Dec. 31, 1929 |
| 1,742,252 | Holden | Jan. 7, 1930 |
| 1,784,150 | Loftin | Dec. 9, 1930 |
| 1,808,524 | Byrnes | June 2, 1931 |

(Other references on following page)

UNITED STATES PATENTS

| | | |
|---|---|---|
| 1,821,032 | Robinson | Sept. 1, 1931 |
| 1,903,542 | Barber | Apr. 11, 1933 |
| 2,046,618 | Finch | July 7, 1936 |
| 2,226,259 | Richards et al. | Dec. 24, 1940 |
| 2,330,241 | Roberts | Sept. 28, 1943 |
| 2,381,173 | MacLean | Aug. 7, 1945 |
| 2,547,251 | Bonadio | Apr. 3, 1951 |
| 2,653,995 | Boyle | Sept. 29, 1953 |
| 2,662,170 | Boelens | Dec. 8, 1953 |
| 2,805,400 | Seddon | Sept. 3, 1957 |
| 2,923,900 | Poschenrieder | Feb. 2, 1960 |

OTHER REFERENCES

Article, "Transistor Radios," by Queen, page 82 et seq., December 1956 edition of "Radio-Electronics."

Article, "All-Transistor Automobile Receiver," page 50, July 1955 edition of "Radio and Television News."

UNITED STATES PATENT OFFICE

CERTIFICATE OF CORRECTION

Patent No. 3,069,626 December 18, 1962

Antonio Lungo

It is hereby certified that error appears in the above numbered patent requiring correction and that the said Letters Patent should read as corrected below.

Column 8, line 71, for "85" read -- 84 --; column 10, lines 30 and 36, for the claim reference numeral "3", each occurrence, read -- 4 --.

Signed and sealed this 3rd day of September 1963.

(SEAL)
Attest:

ERNEST W. SWIDER
Attesting Officer

DAVID L. LADD
Commissioner of Patents